TUNNEL DIODE WITH VARIABLE BIAS FOR VARYING PULSE WIDTH OUTPUT

Filed April 29, 1960

Inventor:
Robert L. Watters,
by John F. Ahern
His Attorney.

United States Patent Office 3,111,592
Patented Nov. 19, 1963

3,111,592

TUNNEL DIODE WITH VARIABLE BIAS FOR VARYING PULSE WIDTH OUTPUT

Robert L. Watters, Schenectady, N.Y., assignor to General Electric Company, a corporation of New York Filed Apr. 29, 1960, Ser. No. 25,785
3 Claims. (Cl. 307—88.5)

This invention relates to electrical pulse generation circuits utilizing semiconductor devices as the generating element and particularly to such circuits in which pulses of controlled duration are generated in response to initiating pulses.

More and more present day electronic systems, such as radar and computers, for example, require extensive use of pulse circuits. There is, therefore, a continuing necessity for new and improved circuit arrangements of this type having reliability, circuit simplicity and small size. In addition, for many applications, such as phase or frequency modulation, for example, it is necessary to have control over the duration of the pulses.

It is an object of this invention, therefore, to provide a new and improved wave generation circuit arrangement which fulfills one or more of the above-described criteria.

It is another object of this invention to provide a pulse generation circuit having means for varying the duration of the pulses.

It is still another object of this invention to provide a new and improved pulse generating circuit to produce pulses of controlled duration which provide a great reduction in circuit components compared to prior art circuits.

The semiconductor device used in the practice of this invention is a narrow junction degenerate semiconductor diode or so-called "tunnel diode." Such diodes are semiconductor devices including a single P-N junction and exhibiting a region of negative resistance in the low forward voltage range of their current-voltage characteristics.

Such devices are fabricated so as to provide regions of P- and N-type conductivity having a very narrow junction therebetween, both of the regions being "degenerate." The use of the term "degenerate" refers to a body or region of semiconductive material which, if N-type, contains a sufficient concentration of excess donor impurity to raise the "Fermi-level" thereof to a value of energy higher than the minimum energy of the conduction band on the energy band diagram of the semiconductive material. In a P-type semiconductive body or region, degeneracy means that a sufficient concentration of excess acceptor impurities are present therein to depress the "Fermi-level" to an energy lower than the maximum energy of the valence band on the energy band diagram for the semiconductive material. The "Fermi-level" in such an energy band diagram is the energy level at which the probability of there being an electron present in a particular state is equal to one half.

The forward voltage range of the current-voltage characteristic of such a device at which the negative resistance region appears varies depending upon the semiconductive material from which the device is fabricated. For example, the range of the negative resistance region for a germanium device is from about 0.04 to 0.3 volt while for gallium arsenide the range is from about 0.12 to 0.5 volt. It appears that the negative resistance of such a device is independent of frequency from zero cycles (direct current) to well beyond the microwave frequencies.

For further details concerning the narrow junction degenerate semiconductor diode utilized in the practice of this invention, reference may be had to the copending application of Jerome J. Tiemann, Serial No. 74,815, filed December 9, 1960, which is a continuation-in-part of application Serial No. 858,995, filed December 11, 1959, which is assigned to the assignee of the present invention and incorporated herein by reference.

Briefly stated, in accordance with one aspect of this invention, a circuit for generating a pulse of controlled duration comprises a narrow junction degenerate semiconductor diode biased for operation at a single stable condition. An inductance is connected between the diode and the biasing means. An input pulse impressed on the diode through a capacitance initiates a cycle of operation and develops an output pulse at the diode. Means are further provided to vary the bias on the diode producing a corresponding variation in the duration of the output pulse.

The features of my invention which I believe to be novel are set forth with particularity in the appended claims. My invention itself, however, both as to its organization and method of operating, together with further objects and advantages thereof, may best be understood by reference to the following description taken in connection with the accompanying drawing in which:

Figure 1:
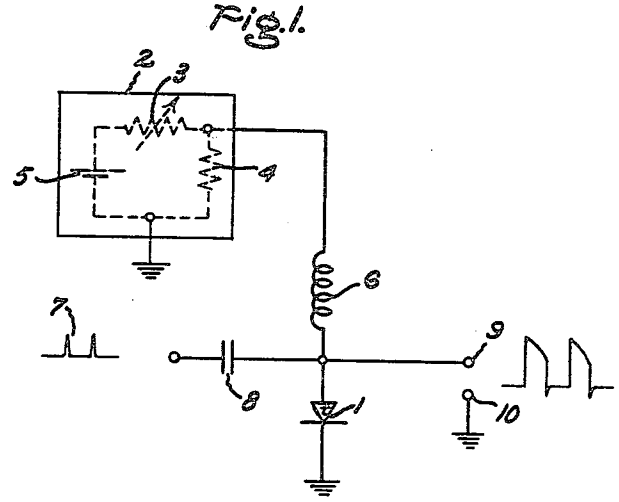
FIG. 1 is a schematic circuit diagram of one embodiment of this invention.

In FIG. 1 there is shown a narrow junction degenerate semiconductor diode 1 connected in circuit with a variable bias means to provide a single stable operating condition. The bias means may include, for example, resistances 3 and 4 and voltage source 5 and establishes a direct current load line of predetermined slope for diode 1. The intersection of the load line with the diode current-voltage characteristic determines the operating point for this circuit arrangement. Since there must be only one stable operating condition for diode 1 in this circuit, resistances 3 and 4 and voltage source 5 of bias means 2 are selected such that a load line is established which intersects the diode characteristic at only one point. Varying the bias changes the point of intersection of the load line with the diode characteristic and hence the diode operating point.

Figure 2:
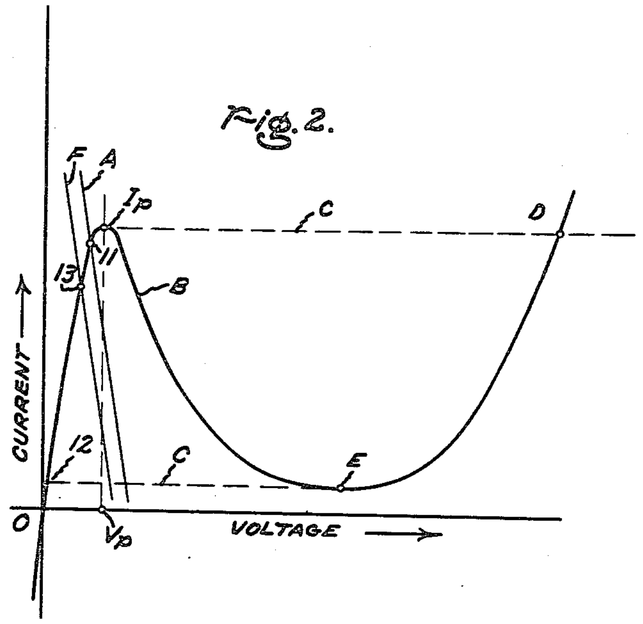
FIG. 2 is a current-voltage characteristic of a typical narrow junction degenerate semiconductor device suitable for use in the practice of this invention illustrating load lines for two different bias conditions.

In FIG. 2, the load line A intersecting the diode characteristic at the point 11 provides a single stable operating condition. To assure that there will always be but one intersection with the diode characteristic the equivalent direct current resistance in shunt with diode 1 should be maintained at a value less than the absolute value of the diode negative resistance. For a bias arrangement, such as shown in phantom in bias means 2 of FIG. 1, resistance 3 is usually large so this requirement can easily be met by assuring that resistance 4 has a value less than the absolute value of the diode negative resistance. An inductance 6 is connected in series circuit between diode 1 and bias means 2. Alternatively, by selection of a suitable voltage source inductance 6 may be connected in series with a resistance and the series combination connected in parallel circuit with the diode if desired. An input pulse 7 impressed on the diode by capacitance 8 in series therewith causes the stability of the circuit to be upset initiating a cycle of operation and developing an output pulse at terminals 9—10 in response thereto. Varying the bias on diode 1 and thereby changing the position of the stable operating point results in a corresponding change in the duration of the output pulse.

For a more detailed description of the operation of the circuit of FIG. 1, assume initially a bias establishing the direct current load line A intersecting the diode characteristic to provide the stable operating point 11 as shown in FIG. 2, and that the input pulses are positive as shown at 7 in FIG. 1.

The arrival of the leading edge of positive input pulse 7 causes the net voltage across diode 1 to be increased. The operating point 11 has been selected such that the magnitude of this leading edge causes the voltage across the diode to exceed the value corresponding to the diode peak curent. The voltage corresponding to the diode peak current is shown as $V_p$ in FIG. 2. Because of the negative resistance region of the diode characteristic, as soon as the voltage reaches this value the operating point jumps abruptly toward the positive resistance branch D—E of the diode characteristic with a consequent increase in voltage across diode 1. The steady state bias voltage on diode 1, however, acts to return the operating point to the stable condition at point 11. Due to the action of inductance 6 in opposing this return, the voltage across diode 1 does not drop instantly to the lower voltage of point 11 but returns gradually until a point near E when it again abruptly jumps to a position near 12 in the positive resistance branch 0–11 of the diode characteristic.

Changing the diode bias such that the load line F is established with the stable operating condition 13 causes the duration of the output pulse to be decreased. For example, the arrival of the leading edge of positive input pulse 7 causes the circuit stability to be upset and a cycle of operation to be initiated as described hereinbefore. With the operating point at the position 13, however, there is a larger voltage acting to move the operating point from the region near point D to point E. Hence, the operating point moves down the branch D—E of the characteristic faster developing an output pulse of shorter duration. In like manner, therefore, increasing the bias on diode 1 produces a pulse of longer duration. Further, the pulse duration is substantially a linear function of the applied bias which is extremely useful for many applications.

One circuit for producing pulses of controlled duration constructed in accordance with the present invention utilized the following circuit parameters, which are given by way of example only.

| | |
|---|---|
| Narrow junction diode 1 | General Electric germanium "tunnel diode" having a peak current of 0.5 milliamp. |
| Bias means 2: | |
| Resistance 3 | 5000 ohms (variable). |
| Resistance 4 | 100 ohms. |
| Voltage source 5 | 1.5 volts. |
| Inductance 6 | 100 milli henries. |
| Capacitance 8 | 22 micromicro farads. |

Pulses were initiated in the above circuit by applying synchronizing pulses from a Tektronix oscilloscope to diode 1 through the 22 micromicrofarad capacitance 8.

The following table illustrates the substantially linear relationship between the pulse duration and the bias on the diode.

| Pulse duration, μsec.: | Bias, volts |
|---|---|
| 35 | .027 |
| 50 | .038 |
| 100 | .076 |
| 150 | .114 |
| 200 | .152 |
| 220 | .165 |

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

What I claim as new and desire to secure by Letters Patent of the United States is:

1. In a circuit for generating a pulse of controlled duration in response to an input pulse applied thereto the combination comprising: a narrow junction degenerate semiconductor diode; an inductance in series circuit with said diode; input means; a capacitance in series with said input means for impressing a series of input pulses of one polarity on said diode; and bias means in circuit with said diode and said inductance establishing a single stable operating condition therefor such that each input pulse initiates a cycle of operation developing an output pulse across said diode; and means for carying the bias on said diode to provide a corresponding variation in the duration of said output pulse.

2. In a circuit for generating a pulse of controlled duration in response to an input pulse applied thereto the combination comprising: a narrow junction degenerate semiconductor diode; an inductance in series circuit with said diode; means for impressing repetitive synchronizing input pulses of one polarity on said diode; bias means in circuit with said diode and said inductance establishing a single stable operating condition for said diode such that a cycle of operation is initiated thereby and an output pulse developed across said diode; and means for varying the bias on said diode to provide a corresponding variation in the duration of said output pulse.

3. In a circuit for generating a pulse of controlled duration in response to an input pulse applied thereto the combination comprising: a narrow junction degenerate semiconductor diode; an inductance in series circuit with said diode; means for applying synchronizing input pulses of one polarity to said diode, each input pulse initiating a cycle of operation and developing an output pulse at said diode; bias means in circuit with said diode and said inductance establishing a single stable operating condition for said diode; and means for varying the bias on said diode to provide a corresponding variation in the duration of said output pulse.

References Cited in the file of this patent

Electronics, Jan. 29, 1960, by Thomas Maguire, pages 55–59.

Electronics, Mar. 4, 1960, by M. M. Perugini and Nilo Lindguen, pages 39–43.

Electronics, Nov. 27, 1959, pages 60 to 64.

Reprint from February 1960 issue of Electrical Manufacturing, 12 pages, article entitled: The Esaki "Tunnel Diode."